(12) United States Patent
Wen et al.

(10) Patent No.: US 10,410,688 B2
(45) Date of Patent: Sep. 10, 2019

(54) MANAGING POWER STATE IN ONE POWER DOMAIN BASED ON POWER STATES IN ANOTHER POWER DOMAIN

(71) Applicant: Apple Inc., Cupertino, CA (US)

(72) Inventors: Shih-Chieh Wen, San Jose, CA (US); Jong-Suk Lee, Sunnyvale, CA (US); Ramesh B. Gunna, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/208,101

(22) Filed: Dec. 3, 2018

(65) Prior Publication Data

US 2019/0221241 A1 Jul. 18, 2019

Related U.S. Application Data

(63) Continuation of application No. 15/628,017, filed on Jun. 20, 2017, now Pat. No. 10,147,464.

(51) Int. Cl.
*G06F 12/08* (2016.01)
*G11C 5/14* (2006.01)
*G06F 1/26* (2006.01)
*G06F 9/28* (2006.01)
*G06F 1/324* (2019.01)
*G06F 1/3296* (2019.01)
*G06F 11/30* (2006.01)
*G06F 11/20* (2006.01)
*G06F 1/30* (2006.01)
*G06F 9/00* (2006.01)
*G06F 1/00* (2006.01)

(52) U.S. Cl.
CPC .............. *G11C 5/141* (2013.01); *G06F 1/26* (2013.01); *G06F 1/30* (2013.01); *G06F 1/324* (2013.01); *G06F 1/3296* (2013.01); *G06F 9/28* (2013.01); *G06F 11/2015* (2013.01); *G06F 11/3058* (2013.01); *G06F 1/00* (2013.01); *G06F 9/00* (2013.01); *G11C 5/148* (2013.01)

(58) Field of Classification Search
CPC ............... G06F 12/084; G06F 12/0802; G06F 12/0806; G06F 12/0811; G06F 12/0815; G06F 12/0817
USPC .......................... 711/117–146; 327/142, 143
See application file for complete search history.

(56) References Cited

U.S. PATENT DOCUMENTS 9,465,432 B2  10/2016 Henry
9,501,129 B2  11/2016 Sistla
2003/0135768 A1*  7/2003 Knee .................... G06F 1/3203
                                                    713/300

(Continued)

*Primary Examiner* — Tomi Skibinski
(74) *Attorney, Agent, or Firm* — Meyertons, Hood, Kivlin, Kowert & Goetzel, P.C.

(57) ABSTRACT

An IC in which a power state of a circuit in one power domain is managed based at least in part on a power state of a circuit in another power domain is disclosed. In one embodiment, an IC includes first and second functional circuit blocks in first and second power domains, respectively. A third functional block shared by the first and second is also implemented in the first power domain. A power management unit may control power states of each of the first, second, and third functional circuit blocks. The power management circuit may, when the first functional circuit block is in a sleep state, set a power state of the third functional block in accordance with that of the second functional circuit block.

20 Claims, 4 Drawing Sheets

(56) References Cited

U.S. PATENT DOCUMENTS

| | | | | |
|---|---|---|---|---|
| 2008/0104324 A1* | 5/2008 | Raghuvanshi | ...... | G06F 12/0802 711/122 |
| 2012/0159074 A1* | 6/2012 | Sodhi | ................. | G06F 12/0895 711/122 |
| 2012/0173907 A1* | 7/2012 | Moses | ................... | G06F 1/3225 713/321 |
| 2013/0304992 A1* | 11/2013 | Lee | .................... | G06F 12/0811 711/122 |
| 2015/0026407 A1* | 1/2015 | McLellan | ........... | G06F 12/0864 711/128 |
| 2015/0143044 A1* | 5/2015 | Gulati | ................. | G06F 12/084 711/121 |
| 2015/0161047 A1* | 6/2015 | Shin | ................... | G06F 12/0811 711/122 |
| 2016/0321183 A1* | 11/2016 | Govindan | ........... | G06F 12/0862 |

* cited by examiner

MANAGING POWER STATE IN ONE POWER DOMAIN BASED ON POWER STATES IN ANOTHER POWER DOMAIN

The present application is a continuation of U.S. application Ser. No. 15/628,017, filed Jun. 20, 2017, (now U.S. Pat. No. 10,147,464); the disclosure of which is incorporated by reference herein in its entirety.

BACKGROUND

Technical Field

This disclosure is directed to integrated circuits, and more particularly, managing power states of functional circuits in different power domains of an integrated circuit.

Description of the Related Art

Integrated circuits (ICs), such as processor, may implement a number of different functional circuit blocks. Such circuit blocks can include processor cores, memories, input/output (I/O) units, graphics processors, and so on. Often, the nature of these different circuits may result in a case where they operate best under certain conditions, such as supply voltage and clock frequency. Accordingly, functional circuit blocks on an IC are often separated into different power domains, wherein the circuitry in one power domain receives power from a source different than circuits in another power domain. These circuits may also operate in a multitude of different power states, including different supply voltages. Accordingly, circuits in different power domains may operate at certain power states independent of circuits in another power domain.

Although different functional circuit blocks may be implemented in different power domains with respect to one another, they may nevertheless communicate with each other during operation. Furthermore, in some instances, functional circuitry in one power domain may be shared between functional circuit blocks implemented in different power domains.

SUMMARY

An IC in which a power state of a circuit in one power domain is managed based at least in part on a power state of a circuit in another power domain is disclosed. In one embodiment, an IC includes first and second functional circuit blocks in first and second power domains, respectively. A third functional block shared by the first and second is also implemented in the first power domain. A power management unit may control power states of each of the first, second, and third functional circuit blocks. The power management circuit may, when the first functional circuit block is in a sleep state, set a power state of the third functional block in accordance with that of the second functional circuit block.

In one embodiment, the power management unit may comprise a power management circuit on the IC. Each of the first and third functional circuit blocks may operate in one of a first plurality of power states, while the second functional circuit block may be operated in one of a second plurality of power states, each of which is different than those of the first. When the first functional circuit block is in the sleep state, the power management circuit may set the power state of the third functional circuit block to one of the first plurality of power states that most closely matches the one of the second plurality of power states in which the second functional circuit block is currently operating. In addition, or alternatively thereto, the power management circuit may set the power state of the third functional block to one of the first plurality of power states that provides sufficient bandwidth for the desired operations while optimizing power efficiency. When the first functional circuit block is active, the power management circuitry may set the power state of the third functional circuit block to match that of the first.

In one embodiment, power management circuitry may, responsive to a change in the power state of the second functional circuit block, inhibit further changes thereto for at least a predetermined time thereafter. The first and second functional circuit blocks, in one embodiment, may be processor cores of first and second types, respectively, while the third functional circuit block is a cache memory shared by both.

BRIEF DESCRIPTION OF THE DRAWINGS

The following detailed description makes reference to the accompanying drawings, which are now briefly described.

Figure 1:
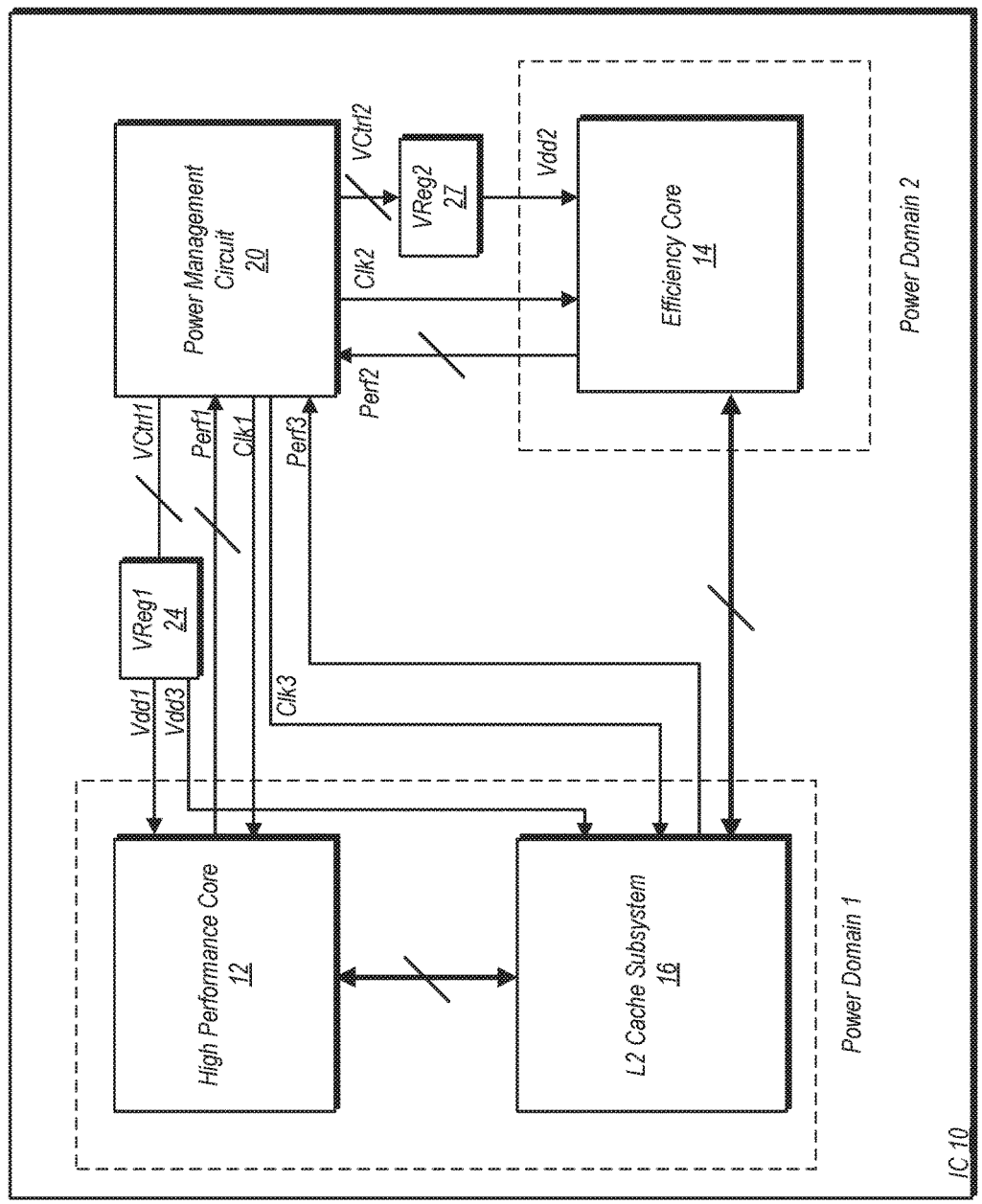
FIG. 1 is a block diagram of one embodiment of an IC.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

FIG. 1 is a block diagram of one embodiment of an exemplary IC. It is noted that IC 10 is shown here for illustrative purposes, and is not intended to be limiting. For example, while the functional circuit blocks illustrated in FIG. 1 and discussed herein are processor cores and a cache memory, the scope of the disclosure is not limited in the way. On the contrary, an IC implementing virtually any type of functional circuit blocks may fall within the scope of this disclosure. Furthermore, other aspects of IC 10 (e.g., the number of power domains) may also vary from one embodiment to the next.

In the embodiment shown, IC 10 includes functional circuit blocks implemented in two different power domains. High performance processor core 12 and a level two (L2) cache subsystem 16 are implemented in Power Domain 1, while Efficiency processor core 14 is implemented in Power Domain 2. High performance processor core 12 in the embodiment shown is a processor core that is optimized for computationally intensive workloads. Efficiency processor core 14 is a processor core that is optimized for efficient handling of workloads (e.g., in terms of power consumption and/or one or more other selected metrics). Thus, IC 10 in the embodiment shown may be considered to be a heterogeneous multi-core processor with two different types of processor cores, each of which is optimized for certain operations. Although not shown, additional circuitry may be provided in IC 10 to allocate workloads to a particular one of processor cores 12 and 14.

Both of high performance processor core 12 and efficiency processor core 14 may implement their own level one (L1) cache subsystems within. However, the L2 cache subsystem 16 shown here is shared by both of the processor cores. Accordingly, at various times during normal operation, either or both of processor cores 14 and 16 may access the L2 cache of L2 cache subsystem 16. Although not explicitly shown, IC 10 may include level shifter circuits to level shift the voltages of signals transferred between L2 cache subsystem 16 (in Power Domain 1) and efficiency processor core 14 (in power domain 2).

IC 10 in the embodiment shown further includes a power management circuit 20. The various functions performed by power management circuit 20 include controlling performance states of the various functional circuit blocks. Each performance state in the embodiment of IC 10 may include at least a clock frequency and an operating voltage (e.g., the supply voltage level). Each of the functional circuit blocks shown, processor cores 12 and 14, along with L2 cache subsystem 16, may have their performance state set independently of one another. However, in the embodiment shown, the performance state of L2 cache subsystem 16 may be set at least in part based on performance states of the other functional circuit blocks shown here, as discussed in further detail below.

The supply voltages to Power Domains 1 and 3 may be provided via voltage regulators 24 and 27, respectively. Voltage regulator 24 in the embodiment shown may actually comprise separate voltage regulation circuits for providing a first supply voltage (Vdd1) to high performance processor core 12, and a second supply voltage (Vdd3) to L2 cache subsystem 10. Both of the supply voltages output from voltage regulation circuit 24 may be variable to be set at one of several different levels, although in this particular embodiment, the levels available to high performance core 12 and L2 cache subsystem 16 may be the same given that they are both implemented in Power Domain 1. Similarly, the supply voltage provided by voltage regulation circuit 27 may also be variable to be set at one of several different levels, although these particular levels may differ from those provided by voltage regulation circuit 24. In both voltage regulation circuit 24 and 27, switching circuitry to switch off their respective supply voltages are provided to enable power-gating of the corresponding functional circuit blocks.

Power management circuit 20 in the embodiment shown is coupled to provide various control signals to voltage regulators 24 and 27. The control signals represented by VCtrl1 may be used to set the various voltages of Vdd1 and Vdd3, and may also be used in power-gating either of high performance processor core or L2 cache subsystem. Similarly, the signals represented by VCtrl2 may be used to set the voltages of Vdd2, and may also be used to power get efficiency processor core 14.

Power management circuit 20 in the embodiment shown is also coupled to provide clock signals to both of processor cores 12 and 14 and to L2 cache subsystem 16. The clock signal Clk1 may be provided to high performance core 12, while Clk2 is provided to efficiency core 14, and Clk3 is provided to L2 cache subsystem 16. Power management circuit 20 may in one embodiment includes separate clock generation circuits (e.g., phase locked loops, or PLLs) for each of these signals. The frequency of each of these clock signals may be independently controllable with respect to the others. Power management circuit 20 may also perform gating of these clock signals, e.g., inhibiting a clock signal from being provided when its corresponding functional circuit block is in an idle state or a sleep state.

Each of the functional circuit blocks in the embodiment shown may provide various performance related signals (Perf1, Perf2, Perf3) to power management circuit 20. Although three performance related signals are illustrated, in some embodiments a greater or lesser number of performance related signals may be used. These signals may include information such as temperatures sensed within these functional circuit blocks, activity levels, and so forth. These signals may also include requests, e.g., a request to be placed into a sleep state when idle. Power management circuit 20 may perform its various power and performance management functions based at least in part on these signals.

As previously noted, power management circuit 20 may control the performance state of L2 cache subsystem based at least in part on a current performance state of high performance processor core 12 and efficiency core 14. In one embodiment, when high performance processor core 12 is in a sleep state (e.g., power-gated, clock-gated, or both), power management circuit 12 may set the performance state of the L2 cache subsystem to one that is ideally the same the current performance state of efficiency core 14. In particular, power management circuit 12 may set the performance state of the L2 cache subsystem to be nearly the same as the current performance state of efficiency core 14 as permissible within appropriate process variations and tolerances. In one embodiment, if the performance states available to Power Domain 1 are different from those available to Power Domain 2, power management circuit 20 may set the performance state of L2 cache subsystem to one that is as close as possible to that of efficiency core 14. Table 1 below provides a list of exemplary performance states for Power Domains 1 and 2:

TABLE 1

| Power Domain 1 | Power Domain 2 |
|---|---|
| V1, F1 | V0, F0 |
| V3, F3 | V2, F2 |
| V5, F5 | V4, F4 |
| V7, F7 | V6, F6 |
| V9, F9 | V8, F8 |

In the example given by Table 1 above, the 'V' terms represent supply voltages, while the 'F' terms represent clock frequencies. The particular voltages and frequencies, in one embodiment, are different for each of the performance states available to Power Domain 1 relative to those available to Power Domain 2. Thus, if high performance core 12 is in a sleep state and efficiency core is set to the performance state comprising V0 and F0, power management circuit 20 may set the performance state of L2 cache subsystem 16 to the performance state comprising V1 and F1. If, on the other hand, efficiency core is operating in the performance state comprising V8 and F8, power management circuit 20 may set the performance state of L2 cache subsystem to either the once comprising V7 and F7, or the one comprising V9 and F9, whichever is closer in voltage and clock frequency. The voltages and frequencies available for Power Domain 1 and Power Domain 2 shown in Table 1 are illustrative, and the number and combinations of voltages and frequencies available for Power Domain 1 and Power Domain 2 may include additional voltages and frequencies as well as different combinations of voltages and frequencies.

If it is ambiguous as to which state is the closest state, power management circuit 20 may use other factors to decide which one is closer, e.g., based on a particular parameter. For example, if efficiency core 14 is operating in the performance state of V8 and F8, where the difference in magnitude between V8 and V7 is equal to that of the difference in magnitude between V8 and V9, but F7 is closer in value to F8 than is F9, power management circuit 20 may set L2 cache subsystem to operate in the performance state comprising V7 and F7.

In general, power management circuit 20 may determine which of the performance states available to L2 cache subsystem 16 is closest to that of the current performance state of efficiency core 14 when determining in which to place the former when high performance core 12 is in a sleep state. It is possible in some embodiments that some performance states are commonly available to both the functional circuit blocks in Power Domain 1 and 2. If efficiency core 14 is operating in one of these common performance states when high performance core 12 is in a sleep state, L2 cache subsystem 16 may be placed into the same performance state, since that would be considered to be the closest available performance state.

When high performance core 12 is active (e.g., not in a sleep state), power management circuit 20 may set the performance state of L2 cache subsystem 16 to the same performance state. This may be done irrespective of the performance state of efficiency core 14. For example, if high performance core 12 is operating in the performance state comprising V9 and F9, power management circuit 20 may set L2 cache subsystem 16 to operate in the same performance state. Thus, the performance state of L2 cache subsystem 16 is set by power management circuit 20 based on that of high performance processor core 12 when the latter is active. When high performance processor core 12 is in a sleep state, the performance state of L2 cache subsystem 16 is set based on that of efficiency processor core 14.

It is noted that while power management circuit 20 is described above and below as having circuitry that performs certain functions, embodiments are possible and contemplated in which some of these functions are performed in software. For example, it is possible that software may monitor the performance demand levels of high performance processor core 12 and efficiency processor core 14, with power management circuit 20 taking actions based on this software monitoring. In general, the functions attributed to power management circuit 20 may be divided between any suitable combination of hardware, software, and firmware.

Figure 2:
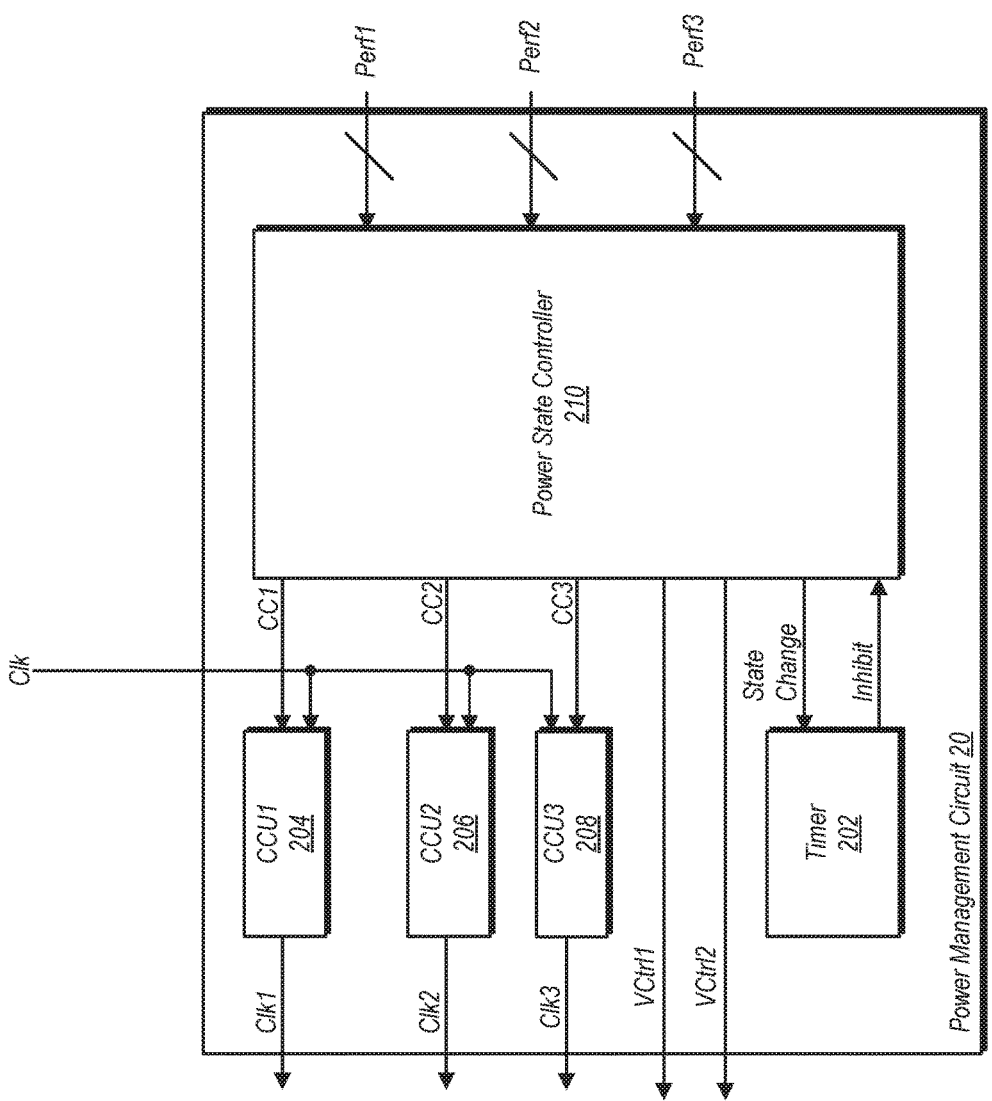
FIG. 2 is a block diagram illustrating one embodiment of a power management circuit.

FIG. 2 is a block diagram of one embodiment of power management circuit 20. In the embodiment shown, power management circuit 20 includes clock control units (CCU) 204, 206, and 208, which are configured to provide clock signals Clk1, Clk2, and Clk3, respectively. Each of CCUs 204, 206, and 208 may include a PLL, and may be coupled to receive a reference clock signal (Clk) from a source external to power management circuit 20.

Power management circuit 20 in the embodiment shown also includes power state controller 210. This circuit block may be the decision making block in determining into which performance state the various functional circuit blocks are placed during operation. Power state controller 210 in the embodiment shown is coupled to receive the various performance related signals (Perf1, Perf2, Perf3) from their corresponding units as discussed above. As previously noted, these signals may include requests, e.g., for a performance state change or placement into a sleep state. The performance related signals may also include signals indicative of, e.g., a sensed temperature, power consumption, workload demand, or other metric of the corresponding functional circuit block from which received. Power state controller 210 may be implemented in one embodiment as one or more state machines to determine which performance state in which a particular functional circuit block is to operate. In another embodiment, power state controller may include processing circuitry that executes instructions to determine an appropriate performance state for a functional circuit block based on the received performance related signals.

Based on the determined performance states for the associated functional circuit blocks, power state controller 210 may set the voltages and frequencies of those states using signals output therefrom. The clock control signals CC1, CC2, and CC3 may be used to set the frequencies output by CCU 204, CCU 206, and CCU 208, respectively. The supply voltage levels may be controlled based on the signals VCtrl1 and VCtrl2.

Power management circuit 20 in the embodiment shown also includes a timer 202 that may be used to introduce hysteresis into performance state changes to prevent switching between performance states too quickly and introducing "singing" capacitor noise issues due to the rapid switching of voltages. The introduction of hysteresis into performance state changes may reduce or eliminate these issues.

In the embodiment shown, power state controller 210 asserts the "State Change" signal responsive to changing the performance state of efficiency processor core 14. Responsive to the assertion of the state change signal, timer 202 asserts the "Inhibit" signal and begins running. When the "Inhibit" signal is asserted, power state controller 210 is inhibited from making additional performance state changes to efficiency processor core 14. When timer 202 determines that a predetermined time has elapsed, it may de-assert the "Inhibit" signal, making efficiency processor core 14 available for further changes to its performance state, allowing power state controller 210 to send VCtrl2 and CC2 signals corresponding to a desired performance state. Thus, using the "Inhibit" signal and the predetermined time value, timer 202 may enforce a limit on the number of times that the efficiency processor core 14 can have its performance state changes in a given time period. In some embodiments, this may result in efficiency processor core 14 remaining at a higher performance state for an increased period of time or at a lower performance state for an increased period of time. Although not directly illustrated in FIG. 2, timer 202 may be used to inhibit rapid performance state changes for L2 cache subsystem 16 in a similar fashion, allowing it to remain at a same performance state as high performance core 12 for a predetermined time according to time 202 after high performance core 12 enters a sleep state before L2 cache subsystem changes to a performance state that more closely matches a performance state of efficiency core 14. Similarly, L2 cache subsystem 16 may remain at a same performance state as efficiency core 14 for a predetermined time according to time 202 after high performance core 12 wakes before L2 cache subsystem changes to a performance state that more closely matches a performance state of high performance core 12.

Figure 3:
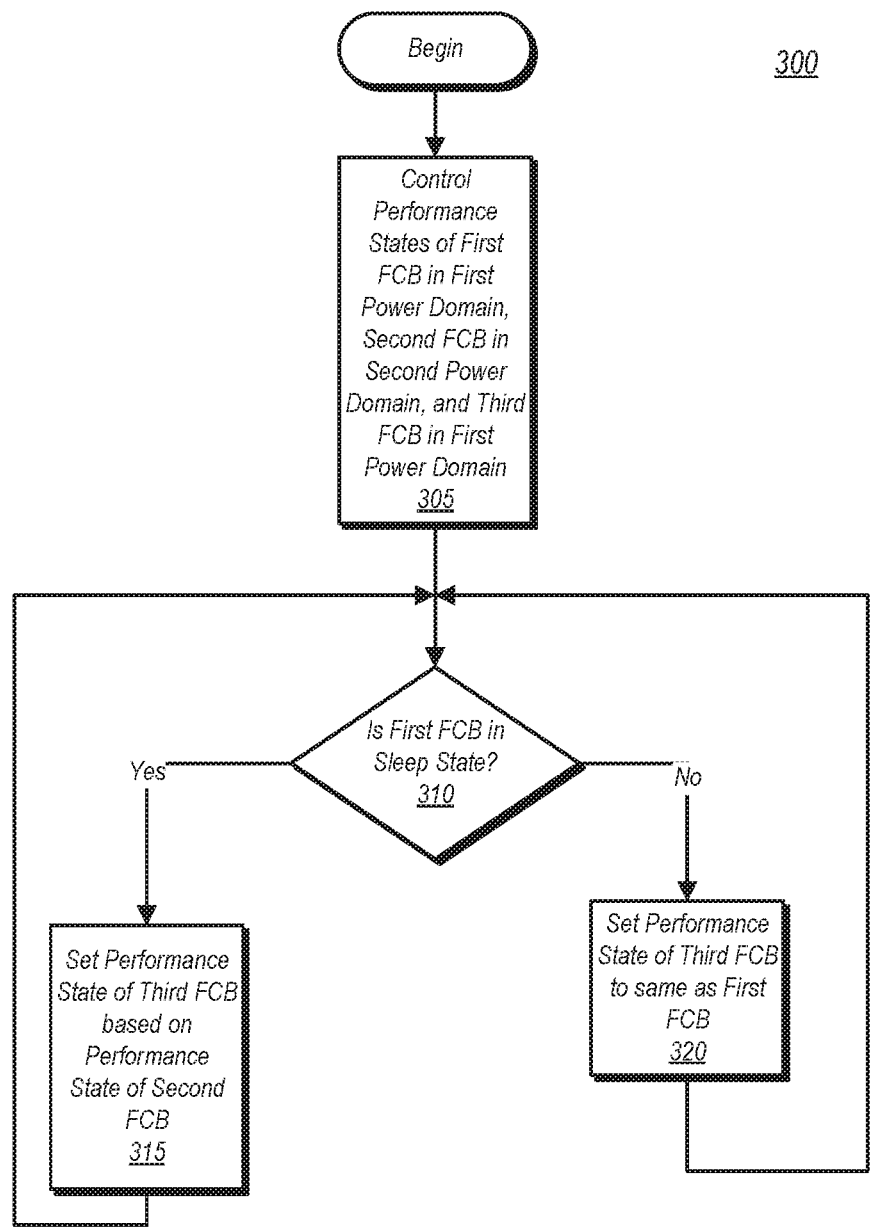
FIG. 3 is a flow diagram illustrating one embodiment of a method for controlling power states of functional circuit blocks in an IC.

FIG. 3 is a flow diagram illustrating one embodiment of a method for controlling power states of functional circuit blocks in an IC. Method 300 may be performed using any of the various hardware embodiments discussed above and shown in the drawings of the present disclosure. Furthermore, embodiments not explicitly discussed in here, and which may be based at least partly in software operation, are also possible and contemplated as having the capability of implementing method 300. Such embodiments are considered to fall within the scope of this disclosure.

Method 300 begins with the operation of an IC, which includes controlling the performance states of a first functional circuit block (FCB) implemented in a first power domain, a second functional circuit block implemented in a second power domain, and a third functional circuit block implanted in the first power domain (block 305). Although the third functional circuit block is implemented in the first power domain, it may nevertheless be a resource that is shared by both the first and second functional circuit blocks. Furthermore, the performance states available to the functional circuit blocks in the first power domain may be at least partially (if not completely) different than those available to functional circuit blocks in the second power domain.

If the first functional circuit block is operating in a sleep state (block 310, yes), the performance state of the third functional circuit block may be set based on a current performance state of the second functional circuit block (block 315). In embodiments where there is no commonality between the performance states available to circuitry in the first power domain and those available to circuitry in the second power domain, the performance state of the third functional block may be set to one that is considered as close as possible to that of the second functional circuit block. For example, the performance state of the third functional circuit block may be set to one having the closets operation voltage, the closest clock frequency, or both, to the current performance state of the second functional circuit block. Various mechanisms may be used to determine which of the performance state available to the third functional circuit block is closest to a current performance state of the second functional circuit block. If the first functional circuit block is not in a sleep state (block 310, No), then the performance state of the third functional circuit block may be set to the same state of the first functional circuit block (block 320). In some embodiments, the first FCB may correspond to high performance core 12, the second FCB may correspond to efficiency core 14, and the third FCB may correspond to L2 cache subsystem 16.

If the first functional circuit block is not in a sleep state (block 310, No), then the performance state of the third functional circuit block may be set to the same state of the first functional circuit block (block 320).

Figure 4:
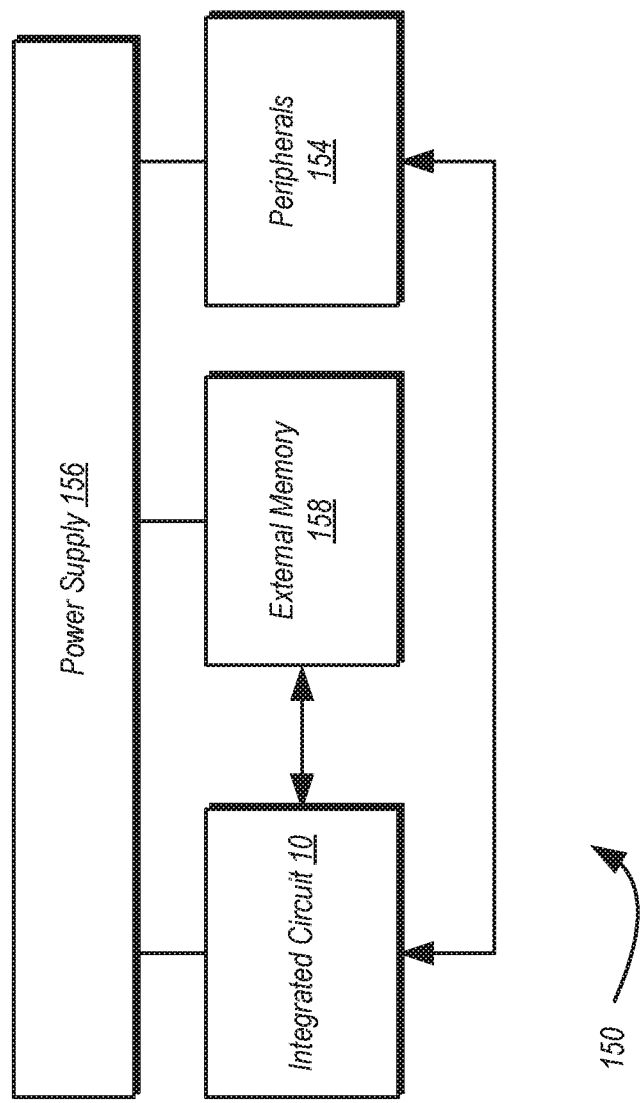
FIG. 4 is a block diagram of one embodiment of an exemplary system.

Turning next to FIG. 4, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
    a first functional circuit block implemented in a first power domain;
    a second functional circuit block implemented in a second, different power domain;
    a third functional circuit block implemented in the first power domain, wherein the third functional circuit block includes a resource shared by the first and second functional circuit blocks; and
    a power management unit configured to, when the first functional circuit block is in a reduced power state, set a power state of the third functional circuit block to a value that is based on a current value of the second functional circuit block.

2. The integrated circuit as recited in claim 1, wherein the first functional circuit block is configured to meet a first performance metric, and wherein the second functional circuit block is configured to meet a second performance metric that is different from the first performance metric.

3. The integrated circuit as recited in claim 1, wherein the reduced power state of the first functional circuit block comprises at least one of the following:
    clock gating the first functional circuit block;
    powering down the first functional circuit block;
    the first functional circuit block being in an idle state.

4. The integrated circuit as recited in claim 1, wherein the first and second functional circuit blocks are processor cores, and wherein the integrated circuit includes a cache subsystem comprising the third functional circuit block.

5. The integrated circuit as recited in claim 1, wherein the power management unit is configured to control respective power states of the first and second functional circuit blocks.

6. The integrated circuit as recited in claim 1, wherein the power management unit is configured to, when the first functional circuit block is active, set a value of the power state of the third functional circuit block to one that is equivalent to a value of a power state of the first functional circuit block.

7. The integrated circuit as recited in claim 1, wherein the power management unit is configured to set a power state of the first functional circuit block to one of a first plurality of power states, and further configured to set the power state of the second functional circuit block to one of a second plurality of power states, wherein at least some of the first plurality of power states are different than those of the second plurality of power states.

8. The integrated circuit as recited in claim 1, wherein responsive to a change in the power state of the second functional circuit block, the power management unit is configured to inhibit additional changes to the power state of the second functional circuit block for a predetermined amount of time.

9. A method comprising:
    controlling, using power management circuitry, power states of first and second functional circuit blocks implemented in first and second power domains, respectively;
    controlling, using the power management circuitry, a power state of a third functional circuit block implemented in the first power domain, wherein the third functional circuit block comprises a resource shared by the first and second functional circuit blocks;
    placing the first functional circuit block in a reduced power state; and
    setting the power state of the third functional circuit block to a value that is based on a current value of the power state of the second functional block responsive to placing the first functional circuit block in the reduced power state.

10. The method as recited in claim 9, further comprising: setting a value of the power state of the third functional circuit block to an equivalent value of the power state of the first functional circuit block when the first functional circuit block is in an active power state.

11. The method as recited in claim 9, further comprising:
    changing the value of a power state of the second functional circuit block; and
    inhibiting, for a predetermined duration, further changes to the value of the power state of the second functional circuit block.

12. The method as recited in claim 9, further comprising:
setting respective values of the power states of the first and third functional circuit blocks to one of a first plurality of power states; and
setting the value of the power state of the second functional circuit block to one of a second plurality of power states;
wherein each of the plurality of power states includes a supply voltage and a clock frequency; and
wherein the power states of the first plurality of power states are different from the power states of the second plurality.

13. The method as recited in claim 9, wherein placing the first functional circuit block in a reduced power state comprises performing one or more of the following:
inhibiting a clock signal from being provided to the first functional circuit block;
inhibiting power from being provided to the first functional circuit block;
determining that the first functional circuit block is in an idle state.

14. A processor comprising:
a first processor core implemented in a first power domain, wherein the first processor core is configured to meet a first performance metric;
a second processor core implemented in a second power domain, wherein the second processor core is configured to meet a second performance metric;
a cache subsystem implemented in the first power domain, the cache subsystem being shared by the first and second processor cores; and
a power management circuit configured to control power states of the first processor core, the second processor core, and the cache subsystem, wherein the power management circuit is further configured to set a value of the power state of the cache subsystem according to a value of a power state of the second processor core when the first processor core is in a reduced power state.

15. The processor as recited in claim 14, wherein the first performance metric is based on computational workloads, and wherein the second performance metric is based on power consumption.

16. The processor as recited in claim 14, wherein the power management core is configured to set respective power states of the first processor core and the cache subsystem to equivalent values when the first processor core is active.

17. The processor as recited in claim 14, wherein the power management circuit is configured to:
place the first processor core and the cache subsystem in one of a first plurality of power states;
place the second processor core in one of a second plurality of power states, the second plurality of power states being different from the first plurality of power states.

18. The processor as recited in claim 17, wherein the first plurality of power states comprises a first plurality of operating voltages and a first plurality of clock frequencies, wherein the second plurality of power states comprises a second plurality of operating voltages and a second plurality of clock frequencies, wherein at least some operating voltages of the first plurality of operating voltages are different than operating voltages of the second plurality of operating voltages, and wherein at least some of the clock frequencies of the first plurality of clock frequencies are different from clock frequencies of the second plurality of clock frequencies.

19. The processor as recited in claim 14, wherein the power management circuit is configured to place the first processor core in a reduced power state by performing at least one of the following:
power gating the first processor core;
clock gating the first processor core.

20. The processor as recited in claim 14, wherein responsive to changing the power state of the second processor core, the power management circuit is configured to, for a limited duration, inhibit subsequent changes to the power state of the second processor core.

* * * * *